US011257706B2

(12) United States Patent
Liu et al.

(10) Patent No.: US 11,257,706 B2
(45) Date of Patent: Feb. 22, 2022

(54) SEMICONDUCTOR DEVICE FLIPPING APPARATUS

(71) Applicant: YANGTZE MEMORY TECHNOLOGIES CO., LTD., Wuhan (CN)

(72) Inventors: Mengyong Liu, Wuhan (CN); Tao Tao Ding, Wuhan (CN); Wu Liu, Wuhan (CN); Rui Yuan Xing, Wuhan (CN); Guoliang Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 512 days.

(21) Appl. No.: 16/210,532

(22) Filed: Dec. 5, 2018

(65) Prior Publication Data

US 2020/0126838 A1    Apr. 23, 2020

Related U.S. Application Data

(63) Continuation of application No. PCT/CN2018/111428, filed on Oct. 23, 2018.

(51) Int. Cl.
*H01L 21/687* (2006.01)
*H01L 21/683* (2006.01)
*H01L 21/68* (2006.01)

(52) U.S. Cl.
CPC .......... *H01L 21/6838* (2013.01); *H01L 21/68* (2013.01); *H01L 21/68707* (2013.01)

(58) Field of Classification Search
CPC .................. H01L 21/6838; H01L 21/68; H01L 21/68707; H01L 21/67742; H01L 21/67; H01L 21/677; H01L 21/687
See application file for complete search history.

(56) References Cited

U.S. PATENT DOCUMENTS 5,989,346 A * 11/1999 Hiroki ................... C23C 14/566
                                                                  118/719
6,517,130 B1 * 2/2003 Donoso ................ B25J 15/0616
                                                                  294/185
(Continued)

FOREIGN PATENT DOCUMENTS

CN          101207113 A        6/2008
CN          101211758    *    7/2008
(Continued)

OTHER PUBLICATIONS

International Search Report issued in corresponding International Application No. PCT/CN2018/111428 dated Dec. 13, 2018, 4 pages.
(Continued)

*Primary Examiner* — Mahdi H Nejad
(74) *Attorney, Agent, or Firm* — Bayes PLLC

(57) ABSTRACT

Embodiments of apparatus for flipping a semiconductor device and method of using the same are disclosed. In an example, an apparatus for flipping a semiconductor device includes at least one fixture and a rotation unit connected to the at least one fixture. The at least one fixture is configured to hold the semiconductor device by simultaneously pressing a first surface and a second surface of the semiconductor device. The first surface is opposite to the second surface. The rotation unit is configured to rotate the at least one fixture to flip the semiconductor device held by the at least one fixture.

16 Claims, 8 Drawing Sheets

(56) References Cited

U.S. PATENT DOCUMENTS

| | | | |
|---|---|---|---|
| 8,486,803 B2 | 7/2013 | Huang et al. | |
| 9,050,635 B2 * | 6/2015 | Mitsuyoshi | H01L 21/67011 |
| 2002/0157692 A1 * | 10/2002 | Ishihara | B08B 1/04 |
| | | | 134/134 |
| 2014/0234058 A1 | 8/2014 | Murata et al. | |
| 2014/0242756 A1 | 8/2014 | Xue et al. | |
| 2015/0170958 A1 * | 6/2015 | Stumpf | H01L 21/02002 |
| | | | 438/458 |
| 2018/0019225 A1 * | 1/2018 | Matsunaga | H05K 13/0061 |
| 2018/0144967 A1 * | 5/2018 | Dragoi | H01L 23/544 |

FOREIGN PATENT DOCUMENTS

| | | |
|---|---|---|
| CN | 101211758 A | 7/2008 |
| CN | 201490176 A | 5/2010 |
| CN | 203118914 U | 8/2013 |
| CN | 103910196 A | 7/2014 |
| CN | 104103308 A | 10/2014 |
| CN | 104360507 A | 2/2015 |
| CN | 105023869 A | 11/2015 |
| CN | 105374709 A | 3/2016 |
| CN | 106994645 A | 8/2017 |
| CN | 107611061 A | 1/2018 |
| CN | 107611078 A | 1/2018 |
| CN | 109496349 A | 3/2019 |
| KR | 20030026451 A | 4/2003 |
| KR | 20030085300 A | 11/2003 |

OTHER PUBLICATIONS

Written Opinion of the International Searching Authority issued in corresponding International Application No. PCT/CN2018/111428 dated Dec. 13, 2018, 4 pages.

* cited by examiner

- Prior Art -

SEMICONDUCTOR DEVICE FLIPPING APPARATUS

CROSS REFERENCE TO RELATED APPLICATION

This application is continuation of International Application No. PCT/CN2018/111428, filed on Oct. 23, 2018, entitled "SEMICONDUCTOR DEVICE FLIPPING APPARATUS," which is hereby incorporated by reference in its entirety.

BACKGROUND

Embodiments of the present disclosure relate to semiconductor device manufacturing apparatus and method of using the same.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) device architecture can address the density limitation in some planar semiconductor devices, for example, Flash memory devices.

A 3D semiconductor device can be formed by stacking semiconductor wafers or dies and interconnecting them vertically, so that the resulting structure acts as a single device to achieve performance improvements at reduced power and smaller footprint than conventional planar processes. Among the various techniques for stacking semiconductor substrates, bonding, such as hybrid bonding, is recognized as one of the promising techniques because of its capability of forming high-density interconnects.

SUMMARY

Embodiments of apparatus for flipping semiconductor device and method of using the same are disclosed herein.

In one example, an apparatus for flipping a semiconductor device includes at least one fixture and a rotation unit connected to the at least one fixture. The at least one fixture is configured to hold the semiconductor device by simultaneously pressing a first surface and a second surface of the semiconductor device. The first surface is opposite to the second surface. The rotation unit is configured to rotate the at least one fixture to flip the semiconductor device held by the at least one fixture.

In another example, a fixture for holding a semiconductor device includes two arms aligned on opposite sides of the semiconductor device and an extension/retraction mechanism connected to the two arms. The extension/retraction mechanism is configured to move the two arms toward one another in a direction perpendicular to the semiconductor device to simultaneously press the semiconductor device from the opposite sides thereof.

In still another example, a method for flipping a semiconductor device is disclosed. A first surface and a second surface of the semiconductor device are simultaneously pressed by at least one fixture. The first surface is opposite to the second surface. The at least one fixture is rotated by a rotation unit to flip the semiconductor device during the time when the first surface and the second surface of the semiconductor device are simultaneously pressed by the at least one fixture.

In yet another example, a system for bonding a semiconductor device includes a bonding module, a flipping module, and at least one robotic arm. The bonding module is configured to bond a first device chip having a first surface and a second device chip having a second surface to form a bonded semiconductor device. The first surface is opposite to the second surface on the bonded semiconductor device. The flipping module includes at least one fixture configured to hold the bonded semiconductor device by simultaneously pressing the first surface and the second surface on the bonded semiconductor device. The flipping module further includes a rotation unit connected to the at least one fixture and configured to rotate the at least one fixture to flip the bonded semiconductor device held by the at least one fixture. The at least one robotic arm is configured to move and load the bonded semiconductor device from the bonding module to the flipping module.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
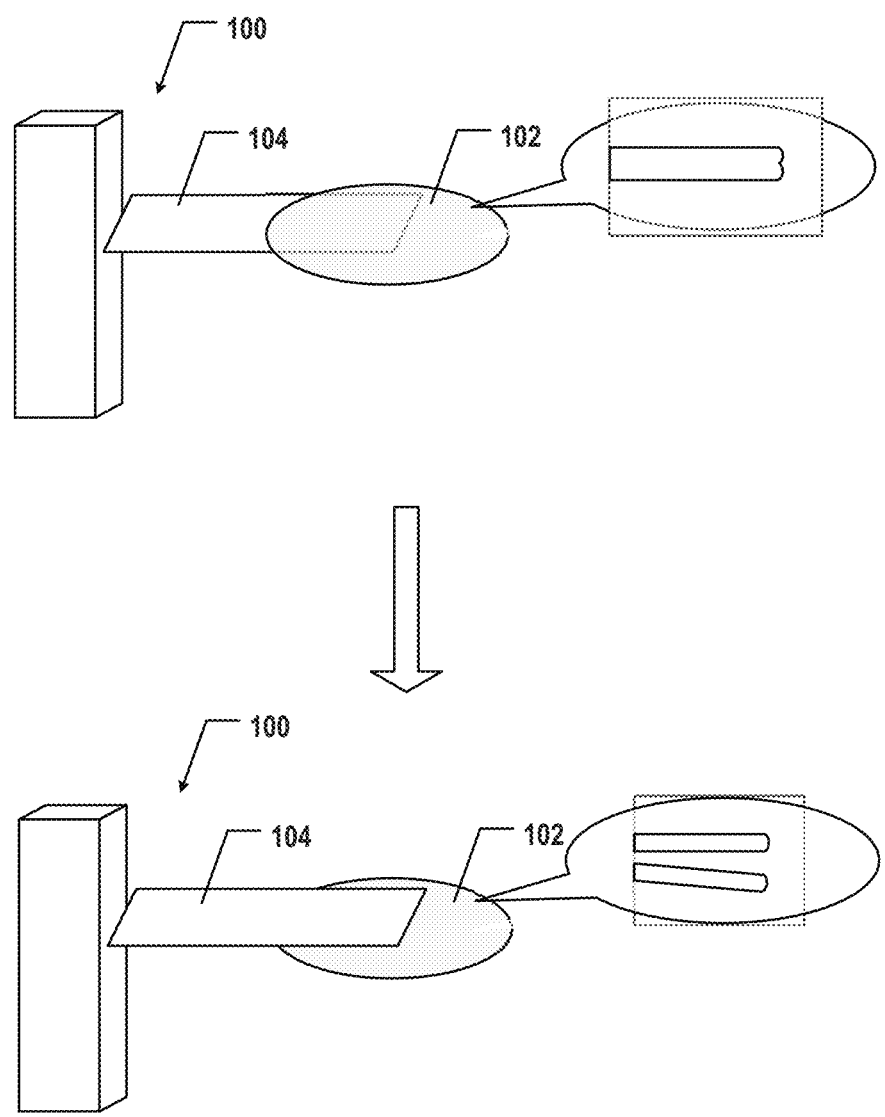
FIG. 1 illustrates an apparatus for flipping a bonded semiconductor device and operations thereof.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In a bonding process, the two wafers to be bonded need to be arranged in a particular stacking order in order to achieve the optimal bonding result, for example, due to different wafer backside smoothness and/or wafer materials. However, after the bonding process, the stacking order may need to be reversed to accommodate the later fabrication processes, which require a different stacking order. As a result, the bonded semiconductor devices often need to be flipped after the bonding process.

Known semiconductor manufacturing apparatus, however, cannot reliably flip bonded semiconductor devices. For example, FIG. 1 illustrates an apparatus 100 for flipping a bonded semiconductor device 102 and operations thereof. Apparatus 100 includes a rotation unit 104 that holds bonded semiconductor device 102 by sucking one surface of bonded semiconductor device 102. As only one device chip of bonded semiconductor device 102 is held by rotation unit 104, when rotation unit 104 rotates bonded semiconductor device 102, another device chip may fall off because the bonding strength immediately after the bonding process (e.g. before the annealing process) is still relatively weak.

Various embodiments in accordance with the present disclosure provide a reliable apparatus for flipping semiconductor devices, in particular, bonded semiconductor devices, immediately after the bonding process (e.g. before the annealing process). During the time when the semiconductor device is flipped, both sides of the semiconductor device are held, for example, by simultaneously pressing two opposite surfaces of the semiconductor device. Thus, the risk of bonded semiconductor device separation can be significantly reduced, thereby increasing the fabrication efficiency and product yield. The apparatus disclosed herein can also be easily integrated into an existing bonding instrument as a flipping module.

The semiconductor devices handled by the semiconductor device flipping apparatus disclosed herein can include any suitable non-monolithic semiconductor devices, such as bonded semiconductor devices. The term "non-monolithic"

means that the components of a semiconductor device are formed separately on different substrates and then bonded to form a bonded semiconductor device. The substrates can include silicon (e.g., single crystalline silicon), silicon germanium (SiGe), gallium arsenide (GaAs), germanium (Ge), silicon on insulator (SOI), glass, quartz, polymer, or any other suitable materials. The bonded semiconductor devices can include, but not limited to, logic devices, volatile memory devices (e.g., dynamic random-access memory (DRAM) and static random-access memory (SRAM)), and non-volatile memory devices (e.g., Flash memory), in a 2D, 2.5D, or 3D architecture.

Figure 2A:
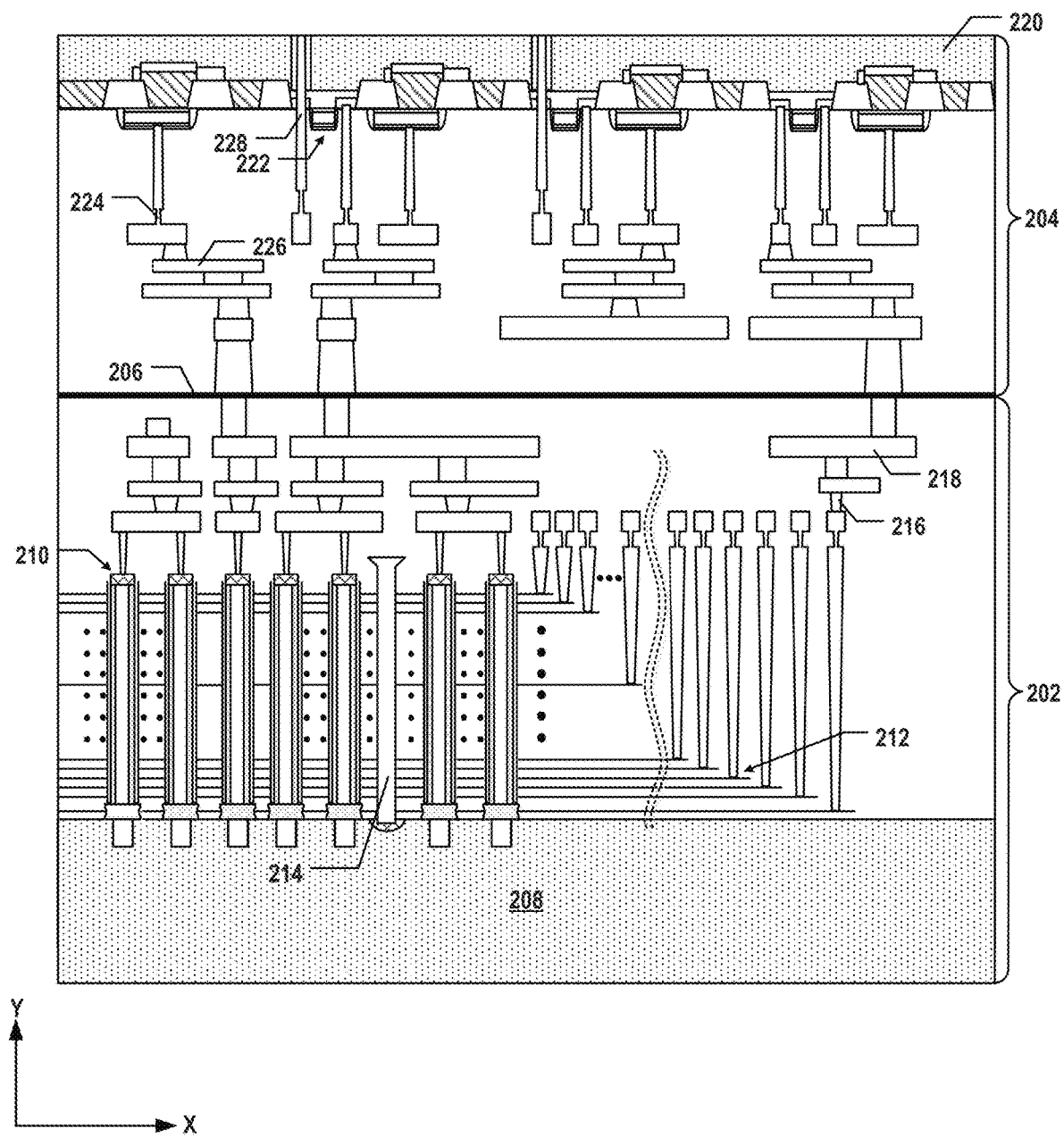
FIG. 2A illustrates a cross-section of an exemplary bonded semiconductor device, according to some embodiments of the present disclosure.

FIG. 2A illustrates a cross-section of an exemplary bonded semiconductor device 200, according to some embodiments of the present disclosure. Bonded semiconductor device 200 can include a memory array device chip 202 and a peripheral device chip 204 bonded on top of memory array device chip 202 in a face-to-face manner at a bonding interface 206. In some embodiments, bonding interface 206 is disposed between memory array device chip 202 and peripheral device chip 204 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously.

It is noted that x and y axes are included in FIG. 2A to further illustrate the spatial relationship of the components in bonded semiconductor device 200 having a substrate 208. Substrate 208 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., bonded semiconductor device 200) is determined relative to the substrate of the semiconductor device (e.g., substrate 208) in the y-direction (i.e., the vertical direction) when the substrate is positioned in the lowest plane of the semiconductor device in the y-direction. The same notion for describing spatial relationship is applied throughout the present disclosure.

In some embodiments, memory array device chip 202 is a NAND Flash memory device in which memory cells are provided in the form of an array of NAND memory strings 210 each extending vertically through a plurality of pairs each including a conductor layer and a dielectric layer (referred to herein as "conductor/dielectric layer pairs"). The stacked conductor/dielectric layer pairs are collectively referred to herein as a "memory stack" 212. The conductor layers and dielectric layers in memory stack 212 can stack alternatingly in the vertical direction. Each NAND memory string 210 can include a semiconductor channel and a composite dielectric layer (also known as a "memory film") including a tunneling layer, a storage layer (also known as a "charge trap/storage layer"), and a blocking layer (not shown). In some embodiments, memory array device chip 202 further includes a gate line slit ("GLS") 214 that extends vertically through memory stack 212. GLS 214 can be used to form the conductor/dielectric layer pairs in memory stack 212 by a gate replacement process and can be filled with conductive materials for electrically connecting an array common source (ACS).

In some embodiments, memory array device chip 202 also includes interconnect layers for transferring electrical signals to and from NAND memory strings 210. As shown in FIG. 2A, memory array device chip 202 can include an array interconnect layer above NAND memory strings 210 that includes a plurality of interconnects (also referred to herein as "contacts"), including vertical interconnect access (via) contacts 216 and lateral interconnect lines 218. As used herein, the term "interconnects" can broadly include any suitable types of interconnects, such as middle-end-of-line (MEOL) interconnects and back-end-of-line (BEOL) interconnects. The array interconnect layer can further include one or more interlayer dielectric (ILD) layers (also known as "intermetal dielectric (IMD) layers") in which interconnect lines 218 and via contacts 216 can form.

Peripheral device chip 204 can include a plurality of transistors 222 disposed below a semiconductor layer 220, such as a thinned substrate. In some embodiments, peripheral device chip 204 can include any suitable digital, analog, and/or mixed-signal peripheral circuits used for facilitating the operation of bonded semiconductor device 200. For example, peripheral device chip 204 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Similar to memory array device chip 202, peripheral device chip 204 can also include interconnect layers for transferring electrical signals to and from transistors 222. As shown in FIG. 2A, peripheral device chip 204 can include a peripheral interconnect layer below transistors 222 and semiconductor layer 220 and also include a BEOL interconnect layer (not shown) above transistors 222 and semiconductor layer 220. In some embodiments, the BEOL interconnect layer includes any suitable BEOL interconnects and contact pads that can transfer electrical signals between bonded semiconductor device 200 and external circuits. The peripheral interconnect layer can include a plurality of interconnects, including interconnect lines 226 and via contacts 224 in one or more ILD layers. In some embodiments, the interconnects in the peripheral interconnect layer also include via contacts 228 (e.g., through silicon vias (TSVs) if semiconductor layer 220 is a thinned silicon substrate) extending vertically through semiconductor layer 220.

Figure 2B:
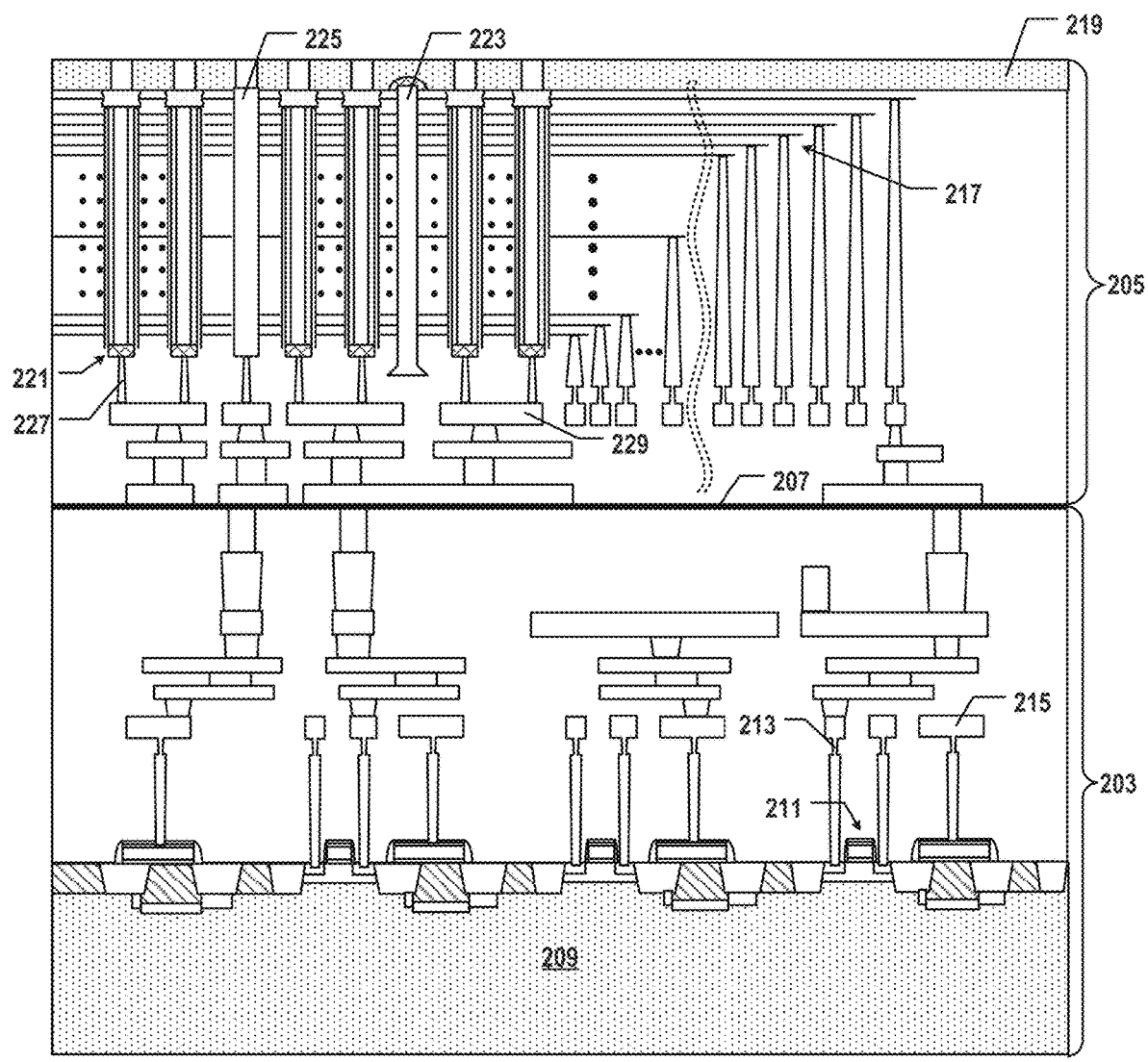
FIG. 2B illustrates a cross-section of another exemplary bonded semiconductor device, according to some embodiments of the present disclosure.

FIG. 2B illustrates a cross-section of another exemplary bonded semiconductor device 201, according to some embodiments of the present disclosure. Similar to bonded semiconductor device 200 described above in FIG. 2A, bonded semiconductor device 201 represents an example of a non-monolithic 3D memory device in which a peripheral device chip 203 and a memory array device chip 205 are formed separately and bonded in a face-to-face manner at a bonding interface 207. Different from bonded semiconductor device 200 described above in FIG. 2A in which peripheral device chip 204 is above memory array device chip 202, bonded semiconductor device 201 in FIG. 2B includes peripheral device chip 203 disposed below memory array device chip 205. It is understood that the details of similar structures (e.g., materials, fabrication process, functions, etc.) in both bonded semiconductor devices 200 and 201 may not be repeated below.

Peripheral device chip 203 can include a plurality of transistors 211 disposed on and/or in a substrate 209. In some embodiments, peripheral device chip 203 can include any suitable digital, analog, and/or mixed-signal peripheral circuits used for facilitating the operation of bonded semiconductor device 201. For example, peripheral device chip 203 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). Peripheral device chip 203 can also include interconnect layers for transferring electrical signals to and from transistors 211. As shown in FIG. 2B, peripheral device chip 203 can include a peripheral interconnect layer above transistors 211. The peripheral interconnect layer can include a plurality of interconnects, including interconnect lines 215 and via contacts 213 in one or more ILD layers.

In some embodiments, memory array device chip 205 is a NAND Flash memory device in which memory cells are provided in the form of an array of NAND memory strings 221 each extending vertically through a memory stack 217 below a semiconductor layer 219 (e.g., a thinned substrate). Each NAND memory string 221 can include a semiconductor channel and a composite dielectric layer (also known as a "memory film") including a tunneling layer, a storage layer (also known as a "charge trap/storage layer"), and a blocking layer (not shown). In some embodiments, memory array device chip 205 further includes a GLS 223 that extends vertically through memory stack 217. GLS 223 can be used to form the conductor/dielectric layer pairs in memory stack 217 by a gate replacement process and can be filled with conductive materials for electrically connecting an array common source ACS.

Memory array device chip 205 can also include interconnect layers for transferring electrical signals to and from NAND memory strings 221. As shown in FIG. 2B, memory array device chip 205 can include a peripheral interconnect layer below NAND memory strings 221 and semiconductor layer 219 and also include a BEOL interconnect layer (not shown) above NAND memory strings 221 and semiconductor layer 219. In some embodiments, the BEOL interconnect layer includes any suitable BEOL interconnects and contact pads that can transfer electrical signals between bonded semiconductor device 201 and external circuits. The peripheral interconnect layer can include a plurality of interconnects, including interconnect lines 229 and via contacts 227 in one or more ILD layers. In some embodiments, memory array device chip 205 further includes one or more through array contacts (TACs) 225 that extend vertically through the entirety of memory stack 217 and at least part of semiconductor layer 219. The upper end of TAC 225 can contact an interconnect in the BEOL interconnect layer (not shown), and the lower end of TAC 225 can contact another interconnect 227 or 229 in the array interconnect layer. TAC 225 can thus make an electrical connection between the peripheral interconnect layer and the BEOL interconnect layer and carry electrical signals from peripheral device chip 203 to the BEOL interconnects of bonded semiconductor device 201.

It is understood that the bonded semiconductor devices that can be handled by the semiconductor device flipping apparatus disclosed herein are not limited to the examples shown in FIGS. 2A-2B and can include any other suitable semiconductor devices, such as logic devices, volatile memory devices (e.g., dynamic random-access memory (DRAM) and static random-access memory (SRAM)), and non-volatile memory devices (e.g., Flash memory), in a 2D, 2.5D, or 3D architecture.

Figure 3:
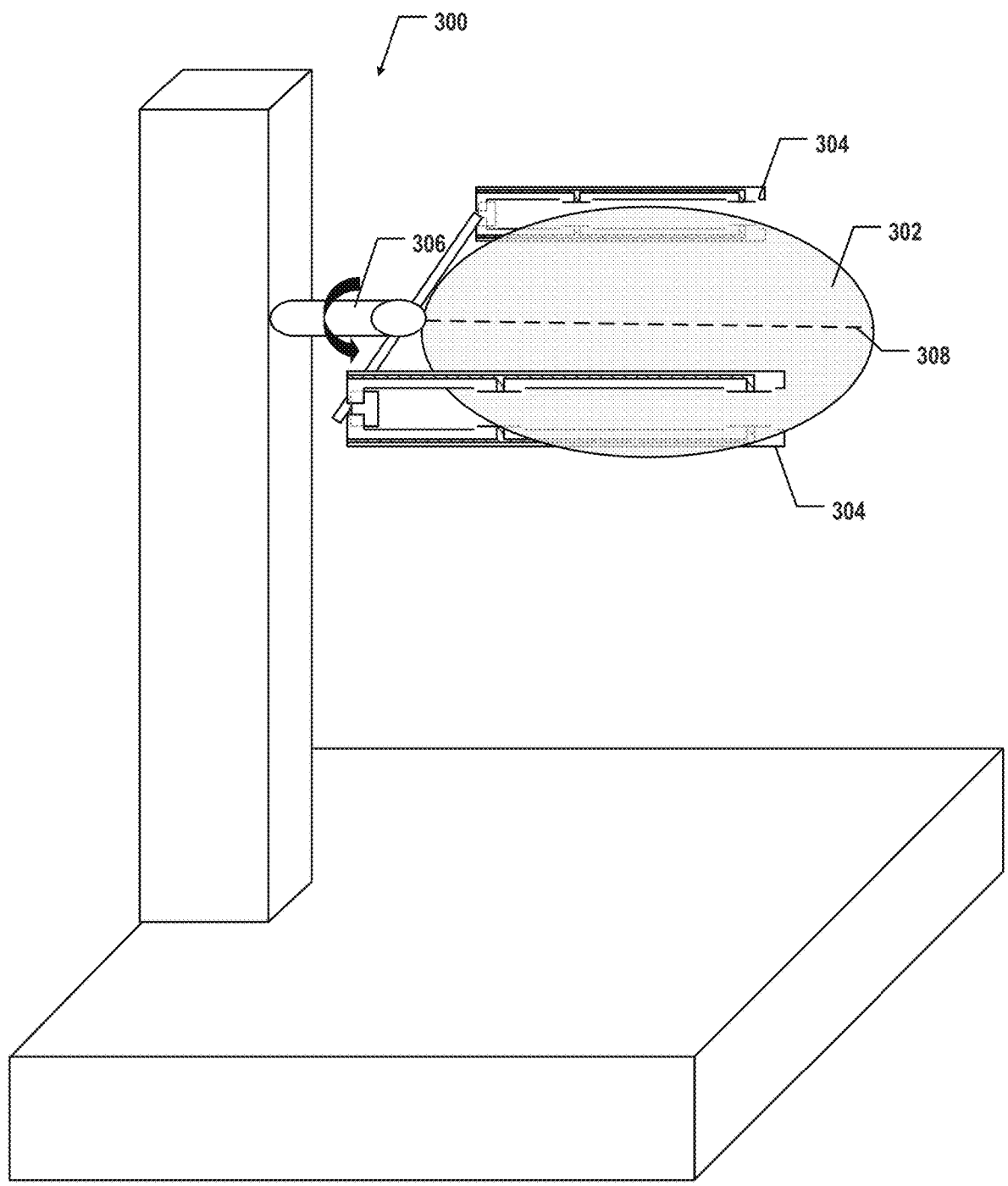
FIG. 3 illustrates a top front perspective view of an exemplary apparatus having fixtures for flipping a semiconductor device, according to some embodiments of the present disclosure.

FIG. 3 illustrates a top front perspective view of an exemplary apparatus 300 having fixtures 304 for flipping a semiconductor device 302, according to some embodiments of the present disclosure. Semiconductor device 302 can be a bonded semiconductor device, such as bonded semiconductor devices 200 and 201 described above in FIGS. 2A-2B. Apparatus 300 can be integrated as a module of a bonding instrument or a standalone fabrication instrument.

Apparatus 300 can flip semiconductor device 302 after the bonding process, but prior to the annealing process. Different from apparatus 100 in FIG. 1 that holds only one side of a semiconductor device (e.g., sucking only one surface of the semiconductor device) during the time when the semiconductor device is flipped, apparatus 300 includes one or more fixtures (e.g., fixtures 304) that can hold both sides of semiconductor device 302, for example, by simultaneously pressing both surfaces of semiconductor device 302 during the time when semiconductor device 302 is flipped. As a result, relative movement between the two device chips bonded together in semiconductor device 302 can be avoided, thereby preventing the separation of the bonded device chips during the time when semiconductor device 302 is flipped.

As shown in FIG. 3, apparatus 300 includes two fixtures 304 having the same structure and symmetrically disposed about a diameter 308 of semiconductor device 302, according to some embodiments. In some embodiments, each fixture 304 is configured to hold semiconductor device 302 by simultaneously pressing two opposite surfaces of semiconductor device 302. One of the two surfaces can be the backside surface of the substrate of semiconductor device 302. In some embodiments, apparatus 300 further includes a rotation unit 306 connected to fixtures 304, for example, via a rod or any suitable connection mechanism that can drive the rotation of fixtures 304 about an axis (e.g., diameter 308 of semiconductor device 302) when rotation unit 306 rotates about the axis. In some embodiments, rotation unit 306 is fixed to a base and driven by a motor or any suitable actuator. The rotation angle of rotation unit 306 can be controlled to flip semiconductor device 302, for example, by about 180 degrees, such as 180 degree. It is understood that the rotation angle of flipping semiconductor device 302 may be between 170 degrees and 190 degrees. The rotation speed can be controlled during the time when flipping semiconductor device 302 to avoid any drastic change of speed.

In some embodiments, semiconductor device 302 includes a first device chip bonded to a second device chip, each of which includes one of the two opposite surfaces of semiconductor device 302. Each fixture 304 of apparatus 300 can simultaneously press the first surface and the second surface of semiconductor device 302, i.e., simultaneously pressing the bonded first and second device chips from opposite sides of semiconductor device 302, during the time when rotation unit 306 rotates semiconductor device 302. As a result, the first and second device chips of semiconductor device 302 do not move with respect to one another in any direction. After semiconductor device 302 is flipped, fixtures 304 can release semiconductor device 302 for later processes.

Figure 4:
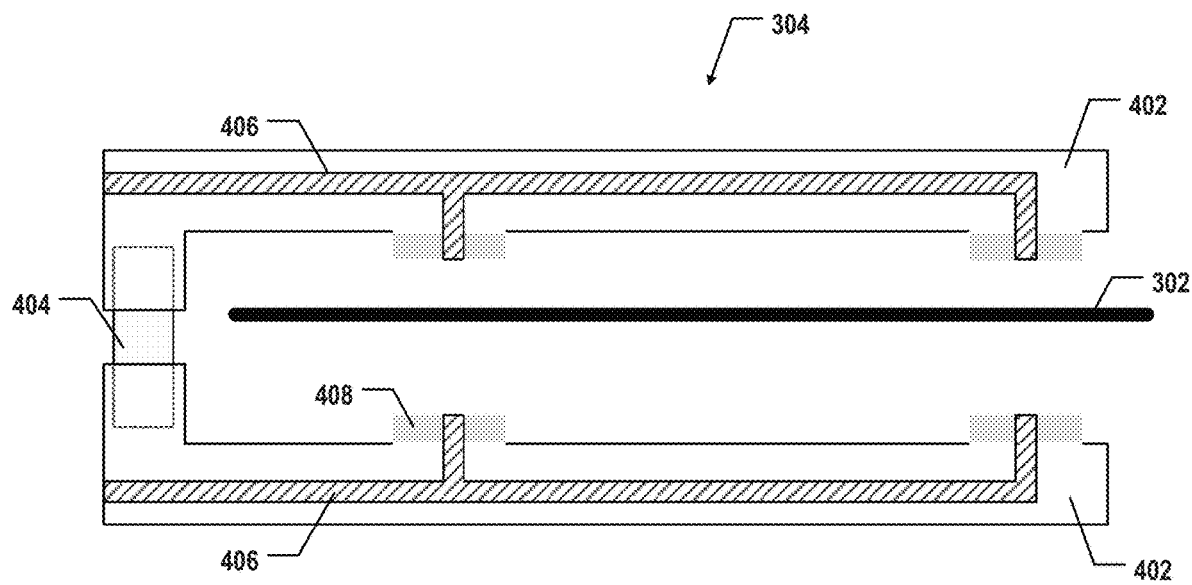
FIG. 4 illustrates a side view of an exemplary fixture for holding a semiconductor device, according to some embodiments of the present disclosure.

FIG. 4 illustrates a side view of an exemplary fixture 304 for holding semiconductor device 302, according to some embodiments of the present disclosure. Fixture 304 can include two arms 402 aligned with one another on opposite sides of semiconductor device 302. Fixture 304 can also include an extension/retraction mechanism 404 connected to two arms 402 and configured to move two arms 402 toward one another and move two arms 402 away from one another in a direction perpendicular to semiconductor device 302. In some embodiments, when extension/retraction mechanism 404 retracts, two arms 402 move toward one another in the direction perpendicular to the first and second surfaces of semiconductor device 302. Conversely, when extension/retraction mechanism 404 extends, two arms 402 move away from one another in the direction perpendicular to the first and second surfaces of semiconductor device 302, according to some embodiments. It is understood that extension/retraction mechanism 404 can include any suitable actuator that can simultaneously cause the relative movement of two arms 402 as described above.

In some embodiments, each arm 402 includes one or more gaskets 408 at one end of arm 402 toward semiconductor device 302, such that when two arms 402 move toward one another, gaskets 408 on both arms 402 contact the first and second surfaces of semiconductor device 302, respectively. Gaskets 408 can be made of any suitable materials, such as rubber, that can be firmly in contact with the surface of semiconductor device 302 to avoid any relative movement and at the same time, act as cushions to avoid damages to the surface of semiconductor device 302. It is understood that the number and/or layout of gaskets 408 are not limited to the example of FIG. 4 and can vary in other embodiments. In some embodiments, the pressure applied on each surface of semiconductor device 302 at gaskets 408 is monitored in real-time and provided to extension/retraction mechanism 404 as feedback to determine when the retraction of extension/retraction mechanism 404 stops, e.g., when the pressure is within a suitable range.

In some embodiments, each arm 402 includes a vacuum path 406 configured to suck the first surface or the second surface of semiconductor device 302. Vacuum path 406 can be fluidically connected to a vacuum source (e.g., a vacuum pump) via tubes to generate suction force by forming negative fluid pressure of air at one end toward semiconductor device 302. In some embodiments, the suction occurs at the same place as gaskets 408. For example, each gasket 408 may include a suction cup or any suitable port of vacuum path 406 that can suck the surface of semiconductor device 302 to further increase the force that holds semiconductor device 302. In some embodiments, the suction force is applied when gaskets 408 contact the surfaces of semiconductor device 302 and is released when gaskets 408 separate from the surfaces of semiconductor device 302. It is understood that the number and/or layout of vacuum path 406, e.g., the suction cups, are not limited to the example of FIG. 4 and can vary in other embodiments. It is further understood that in some embodiments, one or both arms 402 do not include vacuum path 406.

Figure 5A:
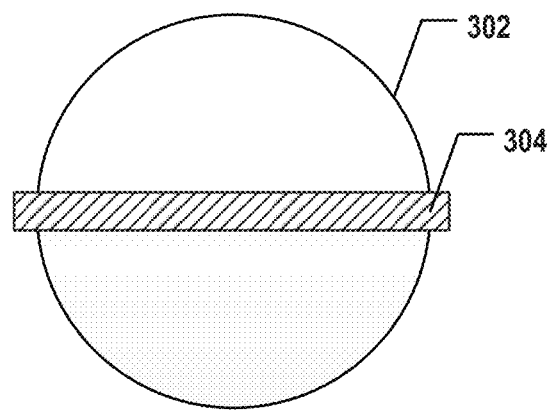
FIG. 5A illustrates a top view or a bottom view of an exemplary single fixture holding a semiconductor device, according to some embodiments of the present disclosure.
Figure 5B:
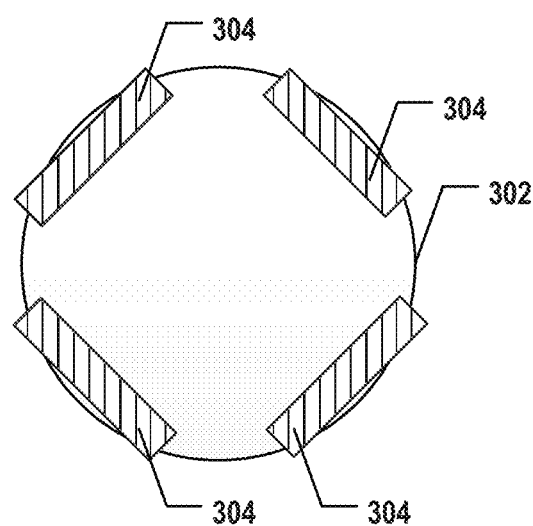
FIG. 5B illustrates a top view or a bottom view of four exemplary fixtures holding a semiconductor device, according to some embodiments of the present disclosure.

The number and/or layout of fixtures 304 can vary in various embodiments. As described above with respect to FIG. 3, two fixtures 304 can be symmetrically disposed about diameter 308 of semiconductor device 302. FIG. 5A illustrates a top view or a bottom view of an exemplary single fixture 304 holding semiconductor device 302, according to some embodiments of the present disclosure. FIG. 5B illustrates a top view or a bottom view of four exemplary fixtures 304 holding semiconductor device 302, according to some embodiments of the present disclosure. As illustrated in FIG. 5A, single fixture 304 can be disposed across the center of semiconductor device 302. As illustrated in FIG. 5B, four fixtures 304 can be spaced apart from one another, for example, along the edge of semiconductor device 302.

Figure 6:
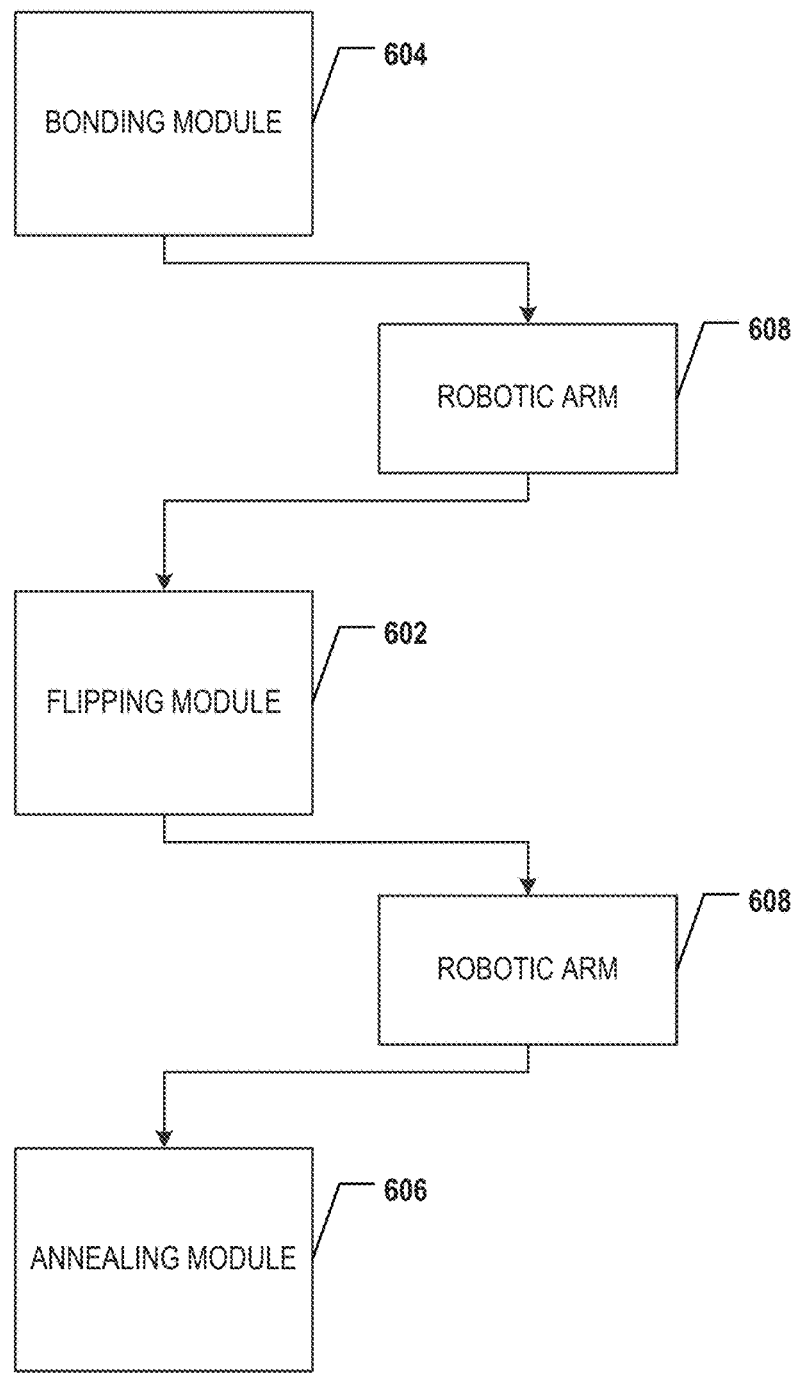
FIG. 6 illustrates a schematic diagram of an exemplary bonding system including a flipping module, according to some embodiments of the present disclosure.

FIG. 6 illustrates a schematic diagram of an exemplary bonding system 600 including a flipping module 602, according to some embodiments of the present disclosure. Bonding system 600 can further include a bonding module 604, an annealing module 606, and one or more robotic arms 608. Bonding module 604 is configured to bond a first device chip and a second device chip to form a bonded semiconductor device, according to some embodiments. Examples of the bonded semiconductor devices include bonded semiconductor devices 200 and 201 described above with respect to FIGS. 2A-2B. The first and second device chips can include a first surface and a second surface, respectively. After the bonding, the first surface is opposite to the second surface on the bonded semiconductor device. In some embodiments, bonding module 604 performs hybrid bonding to form the bonded semiconductor device. It is understood that the bonding strength between the first and second device chips immediately after the bonding by bonding module 604 (e.g., before annealing) may not be strong enough to sustain the flipping operation by conventional flipping apparatus (e.g., apparatus 100).

Flipping module 602 can be configured to flip the bonded semiconductor device formed by bonding module 604 while simultaneously pressing the first surface and the second surface of the bonded semiconductor device, thereby avoiding the risk of separating the bonded first and second device chips during the flipping. One example of flipping module 602 of bonding system 600 is apparatus 300 having fixtures 304 described above with respect to FIGS. 3, 4, and 5A-5B, and the details of apparatus 300 and fixtures 304 are not repeated. Annealing module 606 can be configured to anneal the flipped bonded semiconductor device. In some embodiments, anneal module 606 includes a module for rapid thermal annealing (RTA). By annealing the bonded semiconductor device, the bonding strength between the first and second device chips can be increased to reduce the separation risk in later processes. It is understood that in some embodiments, bonding system 600 does not include annealing module 606. Robotic arm 608 can transfer the bonded semiconductor device between different modules in bonding system 600. In some embodiments, robotic arm 608 is configured to move and load the bonded semiconductor device from bonding module 604 to flipping module 602. In some embodiments, robotic arm 608 is configured to move and load the flipped bonded semiconductor device from flipping module 602 to annealing module 606.

Figure 7:
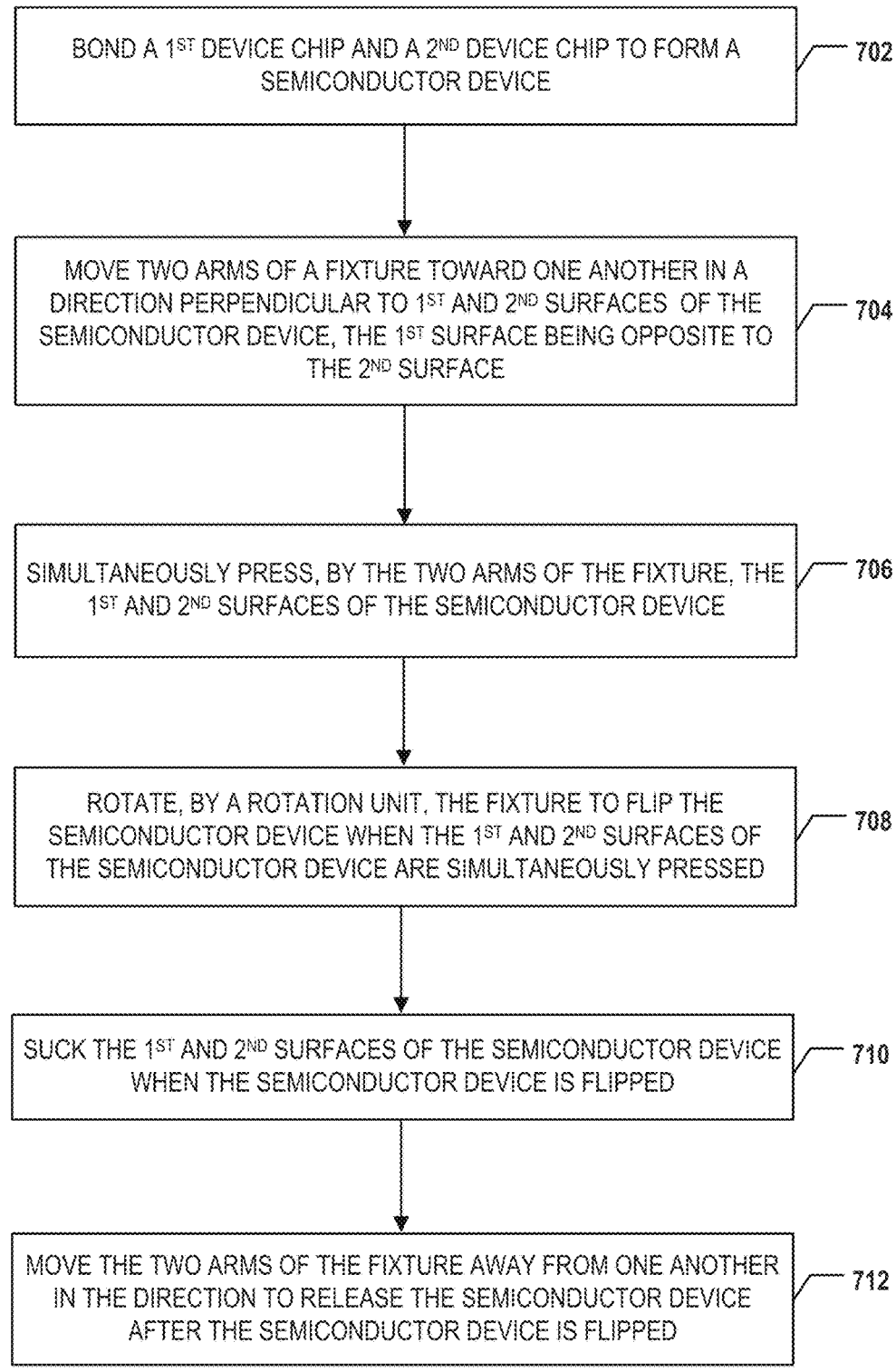
FIG. 7 is a flowchart of an exemplary method for flipping a semiconductor device, according to some embodiments of the present disclosure.

FIG. 7 is a flowchart of a method 700 for flipping a semiconductor device, according to some embodiments of the present disclosure. Examples of the apparatus that can perform operations of method 700 include apparatus 300 depicted in FIG. 3. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a first device chip and a second device chip are bonded to form a semiconductor device. In some embodiments, the first and second device chips are bonded using hybrid bonding in a face-to-face manner, such that the backside substrate surfaces of first and second device chips become the two opposite outer surfaces of the semiconductor device.

After bonding the first and second device chips, the semiconductor device can be moved and loaded to a semiconductor device flipping apparatus, e.g., a module of a bonding instrument, by a robotic arm or any suitable transportation module of the bonding instrument. The semiconductor device flipping apparatus can include at least one fixture having two arms aligned on opposite sides of the semiconductor device after the semiconductor device is loaded to semiconductor device flipping apparatus.

Method 700 proceeds to operation 704, as illustrated in FIG. 7, in which the two arms of each of the at least one fixture are moved toward one another in a direction perpendicular to two opposite surfaces of the semiconductor device, e.g., a first surface and a second surface. In some embodiments, extension/retraction mechanism 404 of fixture 304 moves two arms 402 toward one another in the direction perpendicular to the first surface and the second surface of semiconductor device 302.

Method 700 proceeds to operation 706, as illustrated in FIG. 7, in which the first surface and the second surface are simultaneously pressed by the at least one fixture. The first device chip and the second device chip of the semiconductor device can be simultaneously pressed, such that the first and second device chips do not move with respect to one another. In some embodiments, extension/retraction mechanism 404 of fixture 304 applies pressure on the first and second surfaces of semiconductor device 302 via two arms 402 of each fixture 304.

Method 700 proceeds to operation 708, as illustrated in FIG. 7, in which the at least one fixture is rotated by a rotation unit to flip the semiconductor device during the time when the first surface and the second surface of the semiconductor device are simultaneously pressed by the at least one fixture. In some embodiments, rotation unit 306 rotates each fixture 304 by 180 degrees about diameter 308 of semiconductor device 302 to flip semiconductor device 302 during the time when the first and second surfaces of semiconductor device 302 are simultaneously pressed by two arms 402 on opposite sides of semiconductor device 302.

Method 700 proceeds to operation 710, as illustrated in FIG. 7, in which the first surface and the second surface of the semiconductor device are sucked during the time when the semiconductor device is flipped. In some embodiments, vacuum path 406 of each arm 402 of fixture 304 sucks the first and second surfaces of semiconductor device 302 during the time when semiconductor device 302 is flipped.

Method 700 proceeds to operation 712, as illustrated in FIG. 7, in which the two arms of each of the at least one fixture are moved away from one another in the direction perpendicular to the semiconductor device to release the semiconductor device after the semiconductor device is flipped. In some embodiments, extension/retraction mechanism 404 of fixture 304 moves two arms 402 away from one another in the direction perpendicular to the first surface and the second surface of semiconductor device 302 to release semiconductor device 302 after semiconductor device 302 is flipped. Once the semiconductor device is flipped, the robotic arm or any suitable transportation module of the bonding instrument can move and load the flipped semiconductor device to another module of the bonding instrument or another fabrication instrument for later processes, such as annealing (e.g., RTA).

According to one aspect of the present disclosure, an apparatus for flipping a semiconductor device includes at least one fixture and a rotation unit connected to the at least one fixture. The at least one fixture is configured to hold the semiconductor device by simultaneously pressing a first surface and a second surface of the semiconductor device. The first surface is opposite to the second surface. The rotation unit is configured to rotate the at least one fixture to flip the semiconductor device held by the at least one fixture.

In some embodiments, each of the at least one fixture includes two arms configured to move toward and away from one another in a direction perpendicular to the first surface and the second surface of the semiconductor device. In some embodiments, each of the at least one fixture includes an extension/retraction mechanism connected to the two arms and configured to move the two arms toward and away from one another in the direction.

In some embodiments, the two arms are aligned on opposite sides of the semiconductor device.

In some embodiments, each of the two arms includes at least one gasket at one end of the arm in contact with the first surface or the second surface of the semiconductor device. In some embodiments, each of the two arms includes a vacuum path configured to suck the first surface or the second surface of the semiconductor device.

In some embodiments, the at least one fixture includes a plurality of fixtures spaced apart from one another. In some embodiments, the at least one fixture includes a single fixture disposed across a center of the semiconductor device.

In some embodiments, the at least one fixture simultaneously presses the first surface and the second surface of the semiconductor device during the time when the rotation unit rotates.

In some embodiments, the semiconductor device includes a first device chip having the first surface and a second device chip having the second surface, the first device chip bonded to second device chip. The at least one fixture can simultaneously press the first device chip and the second device chip, such that the first and second device chips do not move with respect to one another.

According to another aspect of the present disclosure, a fixture for holding a semiconductor device includes two arms aligned on opposite sides of the semiconductor device and an extension/retraction mechanism connected to the two arms. The extension/retraction mechanism is configured to move the two arms toward one another in a direction perpendicular to the semiconductor device to simultaneously press the semiconductor device from the opposite sides thereof.

In some embodiments, each of the two arms includes at least one gasket at one end of the arm in contact with the semiconductor device. In some embodiments, each of the two arms includes a vacuum path configured to suck the semiconductor device.

In some embodiments, the extension/retraction mechanism is configured to move the two arms away from one another to release the semiconductor device.

In some embodiments, the semiconductor device includes a first device chip and a second device chip bonded to the first device chip. The fixture can simultaneously press the first device chip and the second device chip, such that the first and second device chips do not move with respect to one another.

According to still another aspect of the present disclosure, a method for flipping a semiconductor device is disclosed. A first surface and a second surface of the semiconductor device are simultaneously pressed by at least one fixture. The first surface is opposite to the second surface. The at least one fixture is rotated by a rotation unit to flip the semiconductor device during the time when the first surface and the second surface of the semiconductor device are simultaneously pressed by the at least one fixture.

In some embodiments, to simultaneously press, two arms of each of the at least one fixture are moved toward one another in a direction perpendicular to the first surface and the second surface of the semiconductor device.

In some embodiments, the two arms of each of the at least one fixture are moved away from one another in the direction to release the semiconductor device after the semiconductor device is flipped.

In some embodiments, the first surface and the second surface of the semiconductor device are sucked during the time when the semiconductor device is flipped.

In some embodiments, a first device chip having the first surface and a second device chip having the second surface are bonded to form the semiconductor device. The first device chip and the second device chip can be simultaneously pressed, such that the first and second device chips do not move with respect to one another.

According to yet another aspect of the present disclosure, a system for bonding a semiconductor device includes a bonding module, a flipping module, and at least one robotic arm. The bonding module is configured to bond a first device chip having a first surface and a second device chip having a second surface to form a bonded semiconductor device. The first surface is opposite to the second surface on the bonded semiconductor device. The flipping module includes at least one fixture configured to hold the bonded semiconductor device by simultaneously pressing the first surface and the second surface on the bonded semiconductor device. The flipping module further includes a rotation unit connected to the at least one fixture and configured to rotate the at least one fixture to flip the bonded semiconductor device held by the at least one fixture. The at least one robotic arm is configured to move and load the bonded semiconductor device from the bonding module to the flipping module.

In some embodiments, the system further includes an annealing module configured to anneal the flipped bonded semiconductor device. The at least one robotic arm can be configured to move and load the flipped bonded semiconductor device from the flipping module to the annealing module.

In some embodiments, each of the at least one fixture includes two arms configured to move toward and away from one another in a direction perpendicular to the first surface and the second surface of the bonded semiconductor device. In some embodiments, each of the at least one fixture includes an extension/retraction mechanism connected to the two arms and configured to move the two arms toward and away from one another in the direction.

In some embodiments, the two arms are aligned on opposite sides of the bonded semiconductor device.

In some embodiments, each of the two arms includes at least one gasket at one end of the arm in contact with the first surface or the second surface of the bonded semiconductor device. In some embodiments, each of the two arms includes a vacuum path configured to suck the first surface or the second surface of the bonded semiconductor device.

In some embodiments, the at least one fixture simultaneously presses the first surface and the second surface of the bonded semiconductor device during the time when the rotation unit rotates. The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. An apparatus for flipping a semiconductor device, comprising:
    at least one fixture configured to hold the semiconductor device by simultaneously pressing a first surface and a second surface of the semiconductor device, wherein the first surface is opposite to the second surface; and
    a rotation unit connected to the at least one fixture and configured to rotate the at least one fixture to flip the semiconductor device held by the at least one fixture,
    wherein each of the at least one fixture comprises two arms configured to move toward and away from one another in a direction perpendicular to the first surface and the second surface of the semiconductor device;
    each of the two arms comprises at least one gasket at one end of the arm in contact with the first surface or the second surface of the semiconductor device; and
    the semiconductor device is not circumscribed by the two arms.

2. The apparatus of claim 1, wherein each of the at least one fixture comprises an extension/retraction mechanism connected to the two arms and configured to move the two arms toward and away from one another in the direction.

3. The apparatus of claim 1, wherein the two arms are aligned on opposite sides of the semiconductor device.

4. The apparatus of claim 1, wherein each of the two arms comprises a vacuum path configured to suck the first surface or the second surface of the semiconductor device.

5. The apparatus of claim 4, wherein the gasket comprises a suction cup to suck the first surface or the second surface of the semiconductor device.

6. The apparatus of claim 5, wherein the suction cup is formed by rubber.

7. The apparatus of claim 1, wherein the at least one fixture comprises a plurality of fixtures spaced apart from one another.

8. The apparatus of claim 1, wherein the at least one fixture comprises a single fixture disposed across a center of the semiconductor device.

9. The apparatus of claim 1, wherein the at least one fixture simultaneously presses the first surface and the second surface of the semiconductor device during the time when the rotation unit rotates.

10. The apparatus of claim 1, wherein
    the semiconductor device comprises a first device chip having the first surface and a second device chip having the second surface, the first device chip bonded to second device chip; and the at least one fixture simultaneously presses the first device chip and the second device chip, such that the first and second device chips do not move with respect to one another.

11. A system for bonding a semiconductor device, comprising:

a bonding module configured to bond a first device chip having a first surface and a second device chip having a second surface to form a bonded semiconductor device, wherein the first surface is opposite to the second surface on the bonded semiconductor device;

a flipping module comprising:

at least one fixture configured to hold the bonded semiconductor device by simultaneously pressing the first surface and the second surface on the bonded semiconductor device; and a rotation unit connected to the at least one fixture and configured to rotate the at least one fixture to flip the bonded semiconductor device held by the at least one fixture, wherein each of the at least one fixture comprises two arms configured to move toward and away from one another in a direction perpendicular to the first surface and the second surface of the semiconductor device;

each of the two arms comprises at least one gasket at one end of the arm in contact with the first surface or the second surface of the semiconductor device; and the semiconductor device is not circumscribed by the two arms; and at least one robotic arm configured to move and load the bonded semiconductor device from the bonding module to the flipping module.

12. The system of claim 11, further comprising an annealing module configured to anneal the flipped bonded semiconductor device.

13. The system of claim 12, wherein the at least one robotic arm is configured to move and load the flipped bonded semiconductor device from the flipping module to the annealing module.

14. The system of claim 11, wherein the two arms are configured to move toward and away from one another in a direction perpendicular to the first surface and the second surface of the bonded semiconductor device.

15. The system of claim 14, wherein each of the two arms comprises a vacuum path configured to suck the first surface or the second surface of the bonded semiconductor device.

16. The system of claim 15, wherein the gasket comprises a suction cup to suck the first surface or the second surface of the semiconductor device.

* * * * *